(12) United States Patent
Langlois et al.

(10) Patent No.: US 9,078,068 B2
(45) Date of Patent: Jul. 7, 2015

(54) MICROPHONE WITH ALIGNED APERTURES

(75) Inventors: Eric Langlois, Waltham, MA (US); Thomas Chen, Cambridge, MA (US); Xin Zhang, Acton, MA (US); Kieran P. Harney, Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 1378 days.

(21) Appl. No.: 12/133,599

(22) Filed: Jun. 5, 2008

(65) Prior Publication Data

US 2008/0304681 A1    Dec. 11, 2008

Related U.S. Application Data

(60) Provisional application No. 60/942,315, filed on Jun. 6, 2007.

(51) Int. Cl.
  *H04R 25/00* (2006.01)
  *H04R 19/04* (2006.01)
  *H04R 1/22* (2006.01)

(52) U.S. Cl.
  CPC .......... *H04R 19/04* (2013.01); *Y10T 29/49005* (2015.01); *H04R 1/222* (2013.01); *H04R 2499/11* (2013.01)

(58) Field of Classification Search
  None
  See application file for complete search history.

(56) References Cited

U.S. PATENT DOCUMENTS

| | | | | | |
|---|---|---|---|---|---|
| 4,776,019 | A | * | 10/1988 | Miyatake | 381/174 |
| 4,858,719 | A | * | 8/1989 | Fidi et al. | 181/158 |
| 5,684,324 | A | * | 11/1997 | Bernstein | 257/415 |
| 5,870,482 | A | * | 2/1999 | Loeppert et al. | 381/174 |
| 2006/0280319 | A1 | | 12/2006 | Wang et al. | 381/172 |
| 2007/0047744 | A1 | | 3/2007 | Harney et al. | 381/113 |
| 2007/0058826 | A1 | | 3/2007 | Sawamoto et al. | 381/174 |
| 2007/0284682 | A1 | * | 12/2007 | Laming et al. | 257/416 |
| 2008/0175418 | A1 | | 7/2008 | Zhang et al. | 381/174 |
| 2008/0212409 | A1 | * | 9/2008 | Lutz | 367/181 |
| 2009/0074211 | A1 | * | 3/2009 | Hirade et al. | 381/174 |

* cited by examiner

*Primary Examiner* — Duc Nguyen
*Assistant Examiner* — Taunya McCarty
(74) *Attorney, Agent, or Firm* — Maryam Imam; IPxLaw Group LLP

(57) ABSTRACT

A MEMS microphone has a backplate with a given backplate aperture, and a diaphragm having a diaphragm aperture. The given backplate aperture is substantially aligned with the diaphragm aperture.

22 Claims, 11 Drawing Sheets

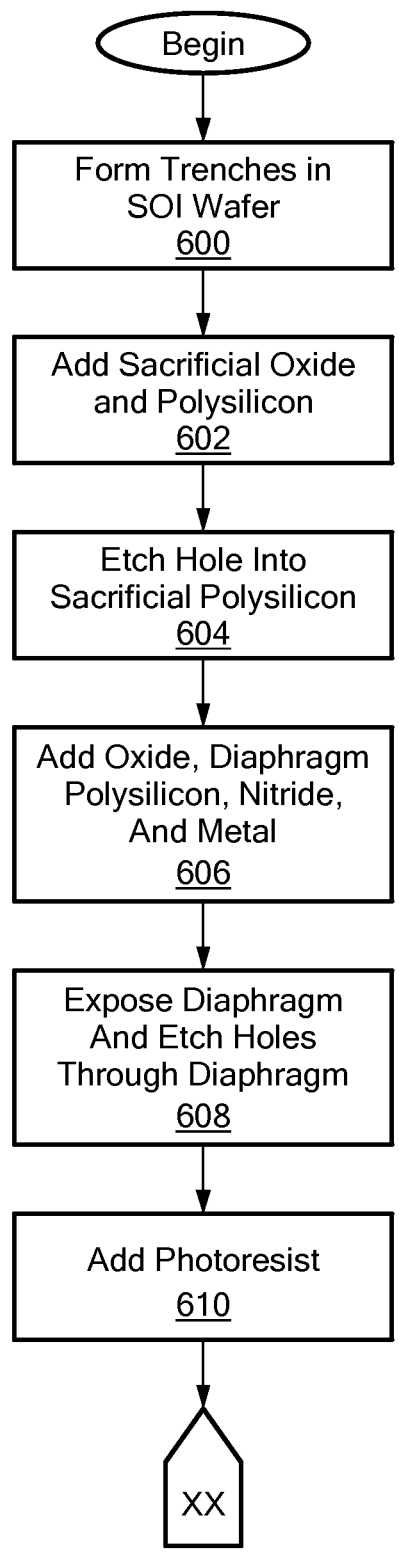
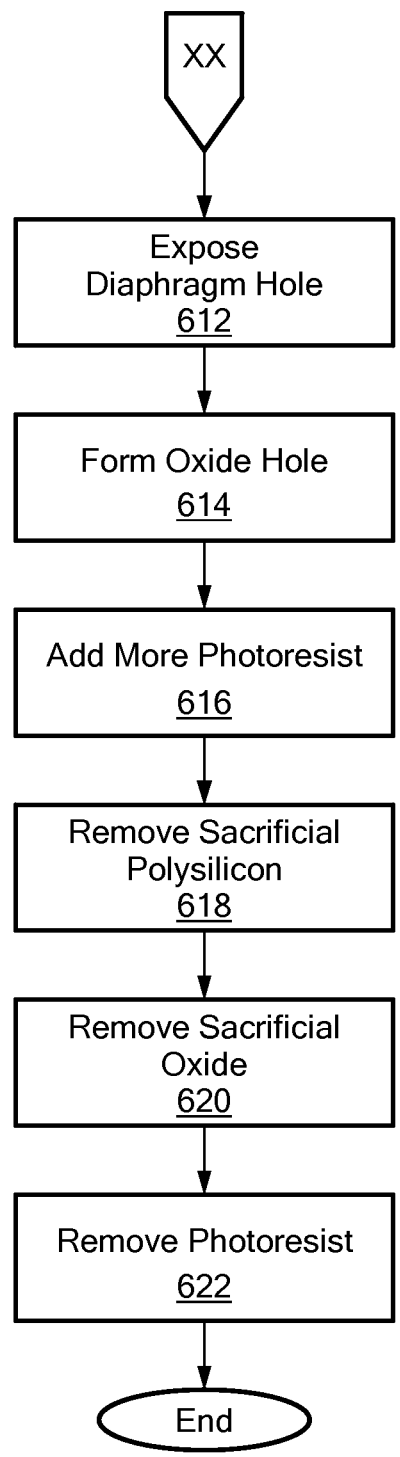
*FIG. 6A*  *FIG. 6B*

MICROPHONE WITH ALIGNED APERTURES

PRIORITY

This patent application claims priority from provisional U.S. patent application No. 60/942,315, filed Jun. 6, 2007, entitled, "MICROPHONE WITH ALIGNED APERTURES,", and naming Eric Langlois, Thomas Chen, Xin Zhang, and Kieran Harney as joint inventors, the disclosure of which is incorporated herein, in its entirety, by reference.

FIELD OF THE INVENTION

The invention generally relates to microphones and, more particularly, the invention relates to controlling the low frequency cutoff point for microphone.

BACKGROUND OF THE INVENTION

Condenser microphones generally have a movable diaphragm that vibrates to produce a signal representative of an incident audio signal. To ensure that audio signals contact their respective diaphragms, prior art condenser microphones known to the inventors have apertures in their backplates directly under a solid portion of the diaphragm. Accordingly, audio signals pass through the backplate apertures to directly contact the diaphragm.

Condenser microphones typically are responsive to audio signals having frequencies that are greater than a predetermined low frequency cutoff point. This low frequency cutoff point often is set by controlling the resistance of the air flowing past the microphone diaphragm. This resistance, however, can be relatively high due to the positioning of the apertures directly under a solid portion of the diaphragm. Undesirably, setting the low frequency cutoff can be difficult due to such high resistance.

One method of controlling this low frequency cutoff point/ resistance varies the gap formed between the diaphragm and the stationary support structure supporting the diaphragm. For example, the gap may be enlarged to raise the cutoff point, or reduced to lower the cutoff point. Such a method, however, has drawbacks. Among other things, it dictates the gap size in a manner that may interfere with other design considerations.

In addition, controlling the gap size often does not sufficiently address the above noted air resistance problem, in which the backplate aperture is directly under a solid portion of the diaphragm. Specifically, a portion of the sound wave path must be generally horizontal to reach the diaphragm gap. As such, controlling the gap size provides relatively coarse control of the cutoff point. Electronic or other non-mechanical means then may be required to sufficiently tune the cutoff point of the microphone.

SUMMARY OF THE INVENTION

In accordance with one embodiment of the invention, a MEMS microphone has a backplate with a given backplate aperture, and a diaphragm having a diaphragm aperture. The given backplate aperture is substantially aligned with the diaphragm aperture.

For example, the given backplate aperture is not offset from the diaphragm aperture. The given backplate may form any of a number of shapes, such as a slot or generally round opening. In a similar manner, the diaphragm aperture also may form any of a number of different shapes, such as a slot.

The backplate may be generally parallel with and spaced in a vertical direction from the diaphragm, while the given backplate aperture may be substantially aligned with the diaphragm aperture in the vertical direction. The MEMS microphone also may have a plurality of springs coupling the diaphragm to a substrate. As such, the plurality of springs may define (at least in part) the diaphragm aperture.

The backplate may have first and second sets of backplate apertures. The given backplate aperture may be in the first set, while the second set of backplate apertures may be offset from the diaphragm aperture.

In accordance with another embodiment of the invention, a MEMS microphone has a stationary support, a movable diaphragm, and a plurality of springs movably connecting the diaphragm to the stationary support. The microphone also has a backplate, with a plurality of apertures, that is spaced from the diaphragm. The stationary support, diaphragm, and springs form a plurality of diaphragm apertures, while a first diaphragm aperture is at least partially aligned with a first backplate aperture.

In this and other embodiments, the backplate may have another backplate aperture that is not aligned with (i.e., it is offset from) the first diaphragm aperture.

In accordance with other embodiments of the invention, a method of forming a MEMS microphone provides a backplate, forms a diaphragm spaced from the backplate, and forms a plurality of backplate apertures. The diaphragm forms a diaphragm aperture, and a given aperture of the backplate apertures is at least partially aligned with the diaphragm aperture.

The diaphragm may be formed by depositing a deposition material onto a sacrificial material supported by the backplate, forming a plurality of springs, and removing the sacrificial material. The plurality of springs suspend the diaphragm so that it is vertically spaced from the backplate. Among other things the backplate may be formed from an SOI wafer (i.e., a silicon-on-insulator wafer).

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIGS. 6A and 6B show a process of forming a microphone that is similar to the microphone 18 shown in FIGS. 2 and 3 in accordance with illustrative embodiments of the invention.

DESCRIPTION OF ILLUSTRATIVE EMBODIMENTS

In illustrative embodiments, the diaphragm and backplate of a MEMS microphone cooperate to reduce air resistance through the microphone. As a result, the microphone can be more easily tuned to a precise low frequency cutoff point. Details of illustrative embodiments are discussed below.

Figure 1:
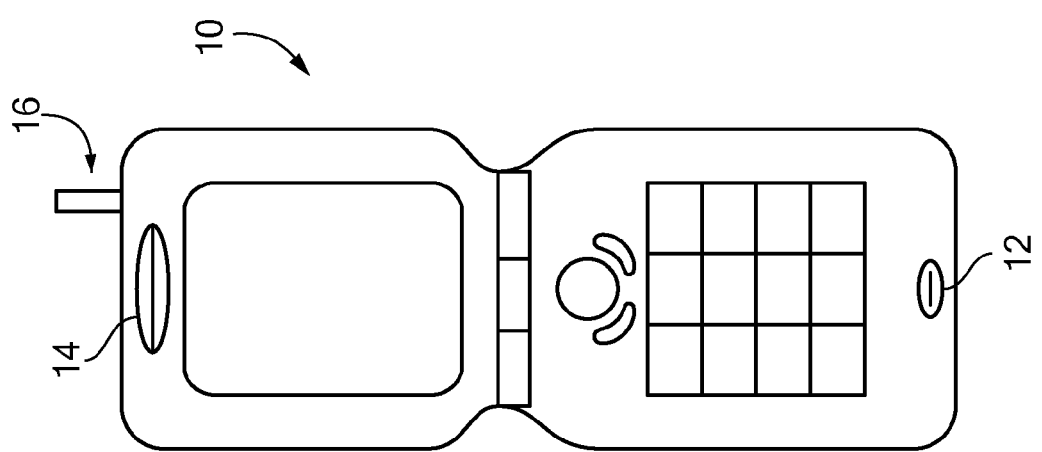
FIG. 1 schematically shows a mobile telephone that may use a MEMS microphone configured in accordance with illustrative embodiments of the invention.

FIG. 1 schematically shows a mobile telephone 10 that can use a microphone configured in accordance with illustrative embodiments. In simplified terms, the telephone 10 has a receiver 12 for receiving an audio signal (e.g., a person's voice), a speaker portion 14 for generating audio signals, and a transponder 16 for transmitting and receiving electromagnetic signals encoding audio signals. During use, a person may speak into the receiver 12, which has a microphone (FIG. 2, discussed below) that converts the person's voice into an electrical signal. Internal logic (not shown) and the transponder 16 modulate this signal to a remote source, such as to a satellite tower and, ultimately, to another person on another telephone 10.

Figure 2:
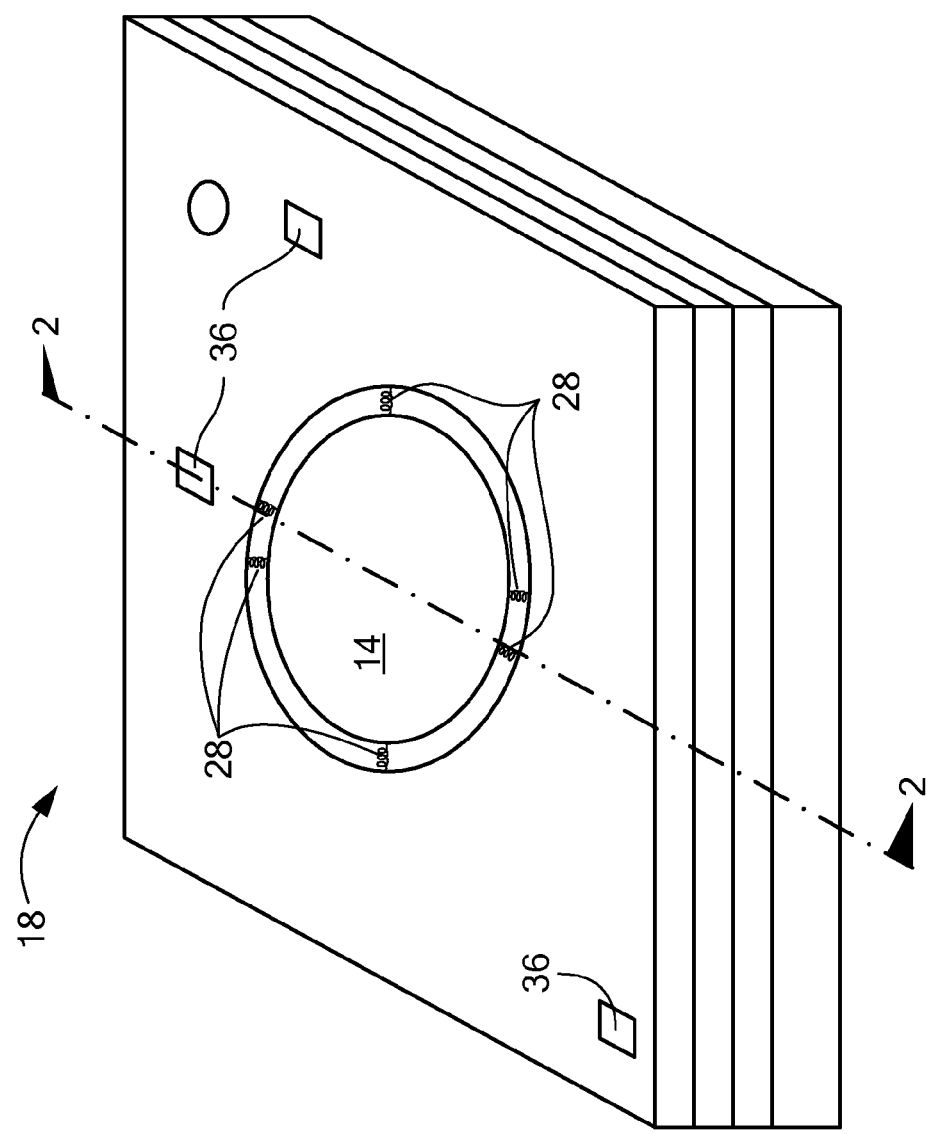
FIG. 2 schematically shows a MEMS microphone that may be configured in accordance with illustrative embodiments of the invention.
Figure 3:
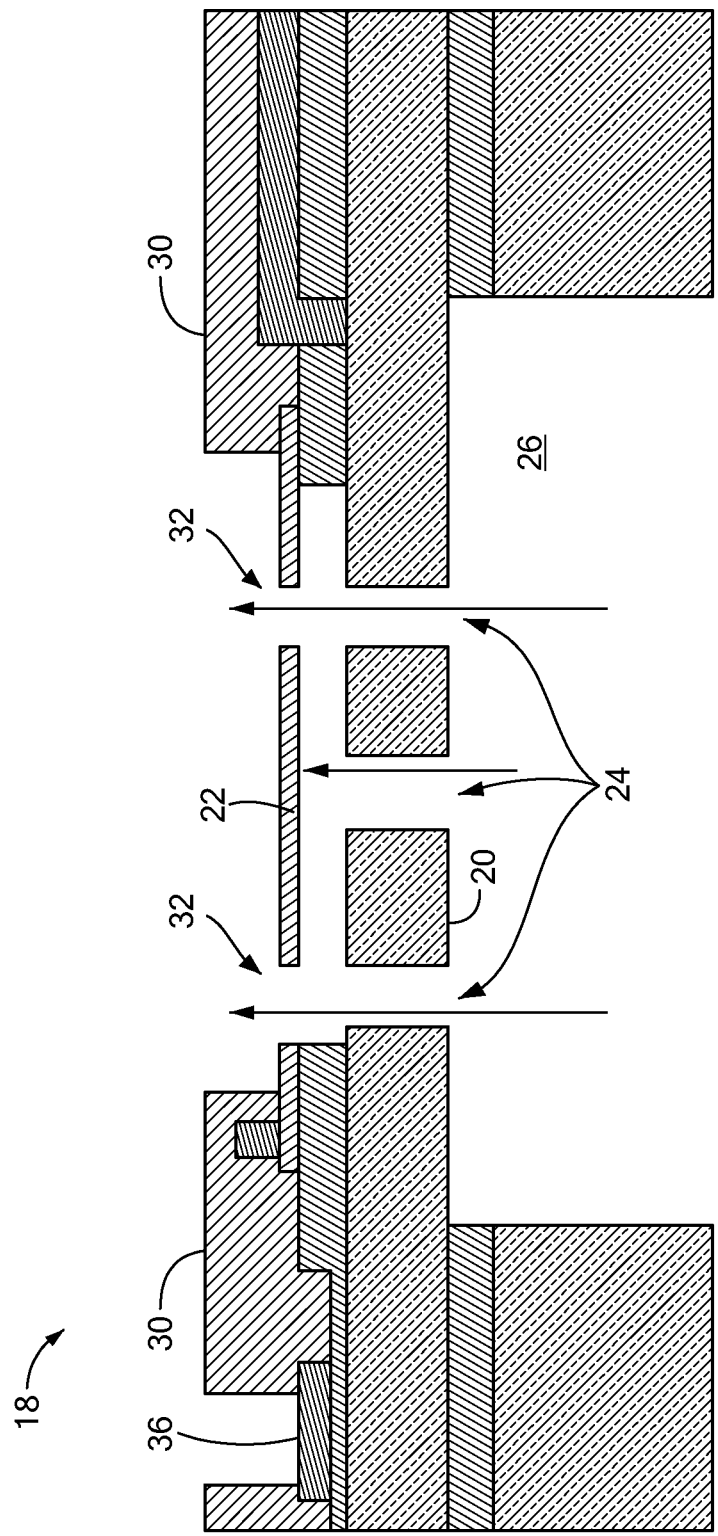
FIG. 3 schematically shows a cross-sectional view of the microphone shown in FIG. 1 across line 2-2.

In illustrative embodiments, the receiver 12 has a microphone mechanically configured with a relatively precise low frequency cutoff point (i.e., the lowest frequency that it can detect without significant distortion-often referred to in the art as the "3 dB point"). FIG. 2 schematically shows a top, perspective view of a MEMS microphone 18 (also referred to as a "microphone chip 18") that may be fabricated in this manner; namely, in accordance with illustrative embodiments of the invention. FIG. 3 schematically shows a cross-sectional view of the same microphone 18 across line 2-2 of FIG. 2.

Among other things, the microphone 18 includes a static backplate 20 that supports and forms a variable capacitor with a flexible diaphragm 22. In illustrative embodiments, the backplate 20 is formed from single crystal silicon (e.g., the top layer of a silicon-on-insulator wafer, discussed below), while the diaphragm 22 is formed from a deposited material, such as deposited polysilicon. Other embodiments, however, use other types of materials to form the backplate 20 and the diaphragm 22. For example, a single crystal silicon bulk wafer, or some deposited material, may form the backplate 20. In a similar manner, a single crystal silicon bulk wafer, part of an silicon-on-insulator wafer, or some other deposited material may form the diaphragm 22.

Figure 4B:
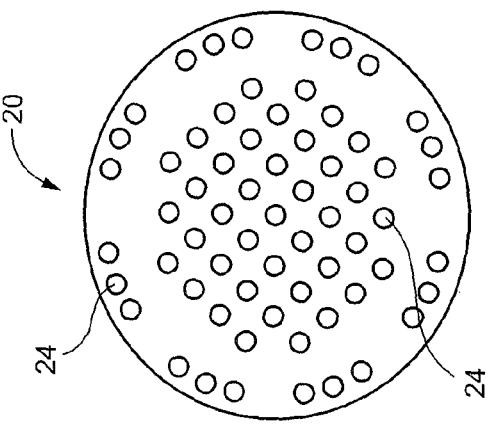
FIGS. 4A and 4B schematically show plan views of two different backplate designs that may be used in accordance with illustrative embodiments of the invention.
Figure 4A:
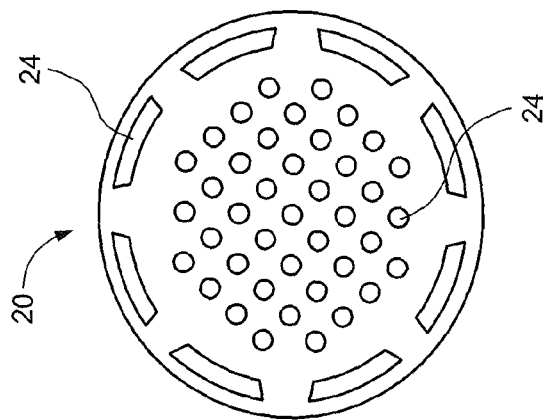

To facilitate operation, the backplate 20 has a plurality of through-hole apertures ("backplate apertures 24") that lead to a backside cavity 26. FIGS. 4A and 4B schematically show plan views of two different backplates 20 that each have different configurations of backplate apertures 24. One such configuration has both generally round holes and slots (i.e., elongated holes), while the other configuration has only generally round holes arranged in a specific pattern. It nevertheless should be noted that the patterns and types of apertures 24 shown in FIGS. 4A and 4B are just illustrative and not intended to limit all embodiments of the invention. Various embodiments thus may employ other configurations of apertures 24.

Springs 28 movably connect the diaphragm 22 to a static/stationary portion 30 of the microphone 18, which includes a substrate (also identified by reference number "30"). The springs 28 effectively form a plurality of apertures that permit at least a portion of the audio signal to pass through the diaphragm 22. These apertures 32, which also are referred to as "diaphragm apertures 32," may be any reasonable shape, such as in the shape of a slot, round hole, or some irregular shape.

Figure 5:
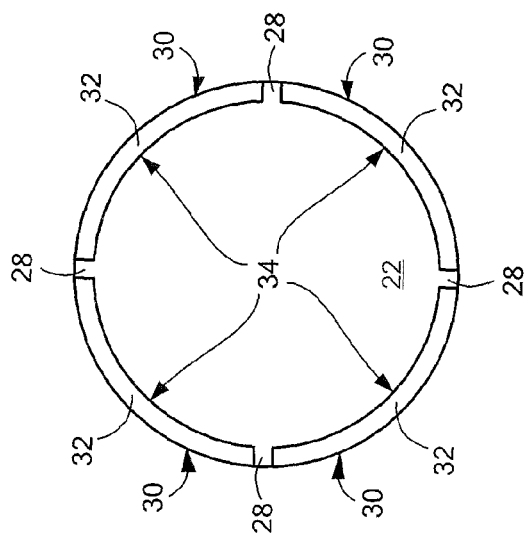
FIG. 5 schematically shows a plan view of a diaphragm that may be used in accordance with illustrative embodiments of the invention.

More specifically, FIG. 5 schematically shows a diaphragm 22 that may be used in accordance with illustrative embodiments of the invention. As shown, the diaphragm 22 has four springs 28 that suspend it to be generally parallel to and above the backplate 20. In other words, from the perspective of FIG. 3, the diaphragm 22 may be considered to be vertically spaced from the backplate 20. With reference to the diaphragm 22 shown in FIG. 5, the following portions of the microphone 18 effectively form each noted diaphragm aperture 32:

1) each adjacent pair of springs 28,
2) the stationary portion 30 immediately adjacent to and between the spring pairs, and
3) the corresponding diaphragm edge 34 between the pair of springs 28.

For example, the apertures 32 shown in FIG. 5 effectively are slots.

Other embodiments, however, may have other types of springs 28 and apertures 24 and 32. For example, the springs 28 may have a serpentine shape, such as that disclosed in co-pending U.S. patent application Ser. No. 12/015,903, filed Jan. 17, 2008, and, the disclosure of which is incorporated herein, in its entirety, by reference. In that patent application, the apertures through the diaphragm have shapes corresponding to the serpentine nature of the springs.

Incident audio signals cause the diaphragm 22 to vibrate, thus producing a changing capacitance between it and the backplate 20. Such audio signals may contact the microphone 18 from any direction. For example, in FIG. 3, the audio signals are shown as traveling upwardly, first through the backplate 20, and then partially through and against the diaphragm 22. In other embodiments, the audio signals may travel in the opposite direction. On-chip or off-chip circuitry (not shown) receive (via contacts 36 of FIG. 2) and convert this changing capacitance into electrical signals that can be further processed.

It should be noted that discussion of the specific microphone 18 shown in FIGS. 2-5 is for illustrative purposes only. Other microphone configurations thus may be used consistent with various embodiments of the invention.

In accordance with illustrative embodiments of the invention, the backplate apertures 24 are substantially aligned with the diaphragm apertures 32. This is in contrast to prior art designs known to the inventors, which offset the vertical alignment of the backplate apertures 24 and diaphragm apertures 32.

Accordingly, as shown in FIG. 3, at least a portion of an incident audio signal can traverse substantially straight through the microphone 18. Such alignment therefore reduces the air resistance through the microphone 18 because a portion of such audio signals does not travel in a direction that is generally parallel to the plane of the diaphragm 22.

In some embodiments, the diaphragm apertures 32 are substantially exactly aligned with the apertures 24 through the backplate 20 (e.g., see FIG. 3). Other embodiments, however, may only partially align the diaphragm apertures 32 and the backplate apertures 24. Moreover, in illustrative embodiments, the aligned backplate apertures 24 are substantially the same shape and area as that of the diaphragm apertures 32. Alternative embodiments, however, do not have such a requirement.

One backplate aperture 24 may at least partially align with one or more diaphragm apertures 32. In a corresponding manner, one diaphragm aperture 32 may at least partially align with one or more backplate apertures 24. Those skilled in the art can use other alignment configurations within the spirit of various embodiments. These configurations may be useful with microphones having serpentine springs. Specifically, microphones having serpentine springs may be considered to form a plurality of regularly or irregularly shaped diaphragm apertures 32. For example, some of those diaphragm apertures 32 may be spaced radially from each other, and/or along the general circumference of the diaphragm 22.

As shown in FIGS. 4A and 4B, the backplate 20 may be considered to have at least two sets of backplate apertures 24; namely, a first set that is not aligned with any diaphragm apertures 32 (i.e., they are offset from the diaphragm apertures 32), and a second set that is substantially aligned with diaphragm apertures 32. The second set shown in FIGS. 4A and 4B are radially outwardly positioned from the first set. Despite that, some embodiments may have additional diaphragm apertures 32 that are not formed by the springs 28, stationary portion 30, and edge 34 of the diaphragm 22. Instead, these diaphragm apertures 32 may be formed by holes through the diaphragm 22 and may have, or may not have, corresponding aligned backplate apertures 24. In fact, some embodiments have both types of diaphragm apertures 32.

As noted above, the inventors discovered that alignment of the diaphragm and backplate apertures 32 and 24, or even partial alignment, enabled them to more precisely tune the low frequency cutoff point while still maintaining relatively thin diaphragm apertures 32. For example, this low frequency cutoff point may be set to between about 50 and 100 Hertz without requiring use of filtering electronics. This is contrary to the inventors' understanding of the prior art, which preferred offset apertures to ensure more of the signal contacted the diaphragm. Thus, contrary to what they understood to be the conventional wisdom, the inventors determined that the resulting signal loss, if any, due to aperture alignment was negligible. Accordingly, since such loss was negligible, the inventors were able to deviate from the prior art practice of intentionally misaligning the noted apertures.

This alignment also provides some stress relief in overpressure events. Specifically, by reducing the air resistance through the microphone 18, this alignment permits air pressure to pass more freely through the microphone 18. As a result, the springs 28 are less stressed and, consequently, less likely to fracture during overpressure events.

FIGS. 6A and 6B show a process of forming a microphone that is similar to the microphone 18 shown in FIGS. 2 and 3 in accordance with illustrative embodiments of the invention. The remaining figures (FIGS. 7A-7G) illustrate various steps of this process. It should be noted that this process does not describe all steps required for forming the microphone 18. Instead, it shows various relevant steps for forming the microphone 18. Accordingly, some steps are not discussed.

The process begins at step 600, which etches trenches 38 in the top layer of a silicon-on-insulator wafer ("SOI wafer 40"). These trenches 38 ultimately form the backplate apertures 24—some of which are aligned in the manner discussed above with the yet-to-be-formed diaphragm apertures 32.

Figure 7A:
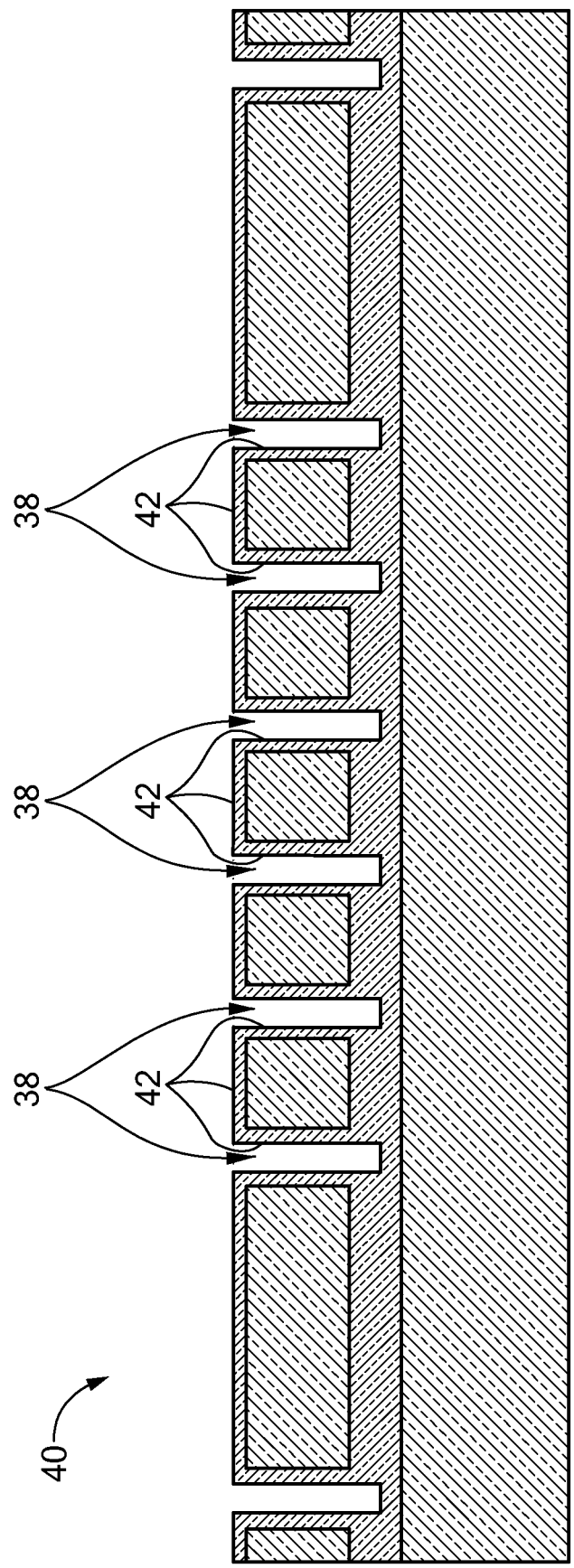
FIGS. 7A-7G schematically show the microphone of FIG. 2 during various stages of fabrication using the process of FIG. 6.

Next, the process adds sacrificial oxide 42 to the walls of the trenches 38 and along at least a portion of the top surface of the top layer of the SOI wafer 40 (step 602). Among other ways, this oxide 42 may be grown or deposited. FIG. 7A schematically shows the wafer at this point in the process. Step 602 continues by adding sacrificial polysilicon 44 to the oxide lined trenches 38 and top-side oxide 42.

Figure 7B:
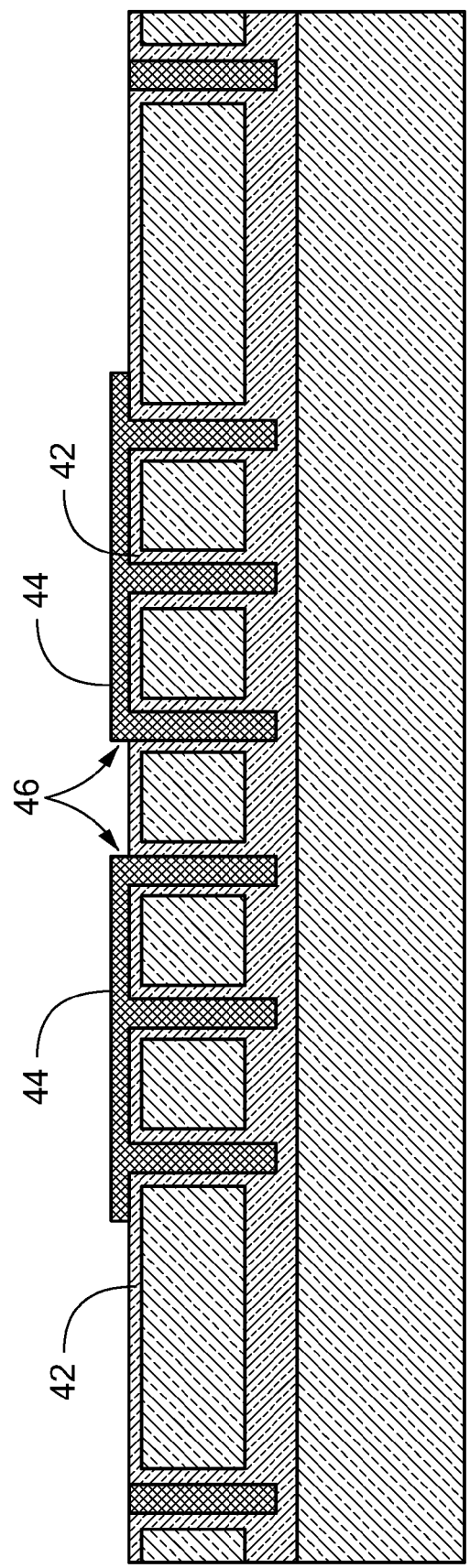
Figure 7C:
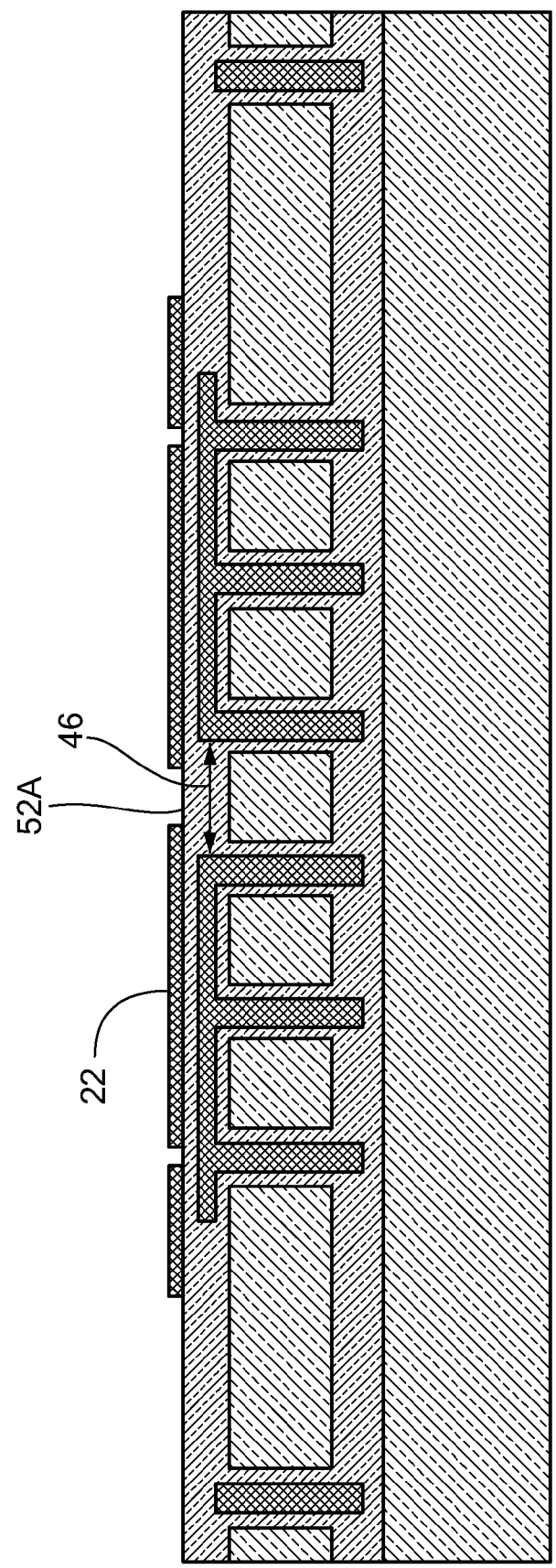

After adding the sacrificial polysilicon 44, the process etches a hole 46 into the sacrificial polysilicon 44 (step 604, see FIG. 7B). The process then continues to step 606, which adds more oxide 42 to substantially encapsulate the sacrificial polysilicon 44. In a manner similar to other steps that add oxide 42, this oxide 42 essentially integrates with other oxides it contacts. Step 606 continues by adding an additional polysilicon layer that ultimately forms the diaphragm 22 (see FIG. 7C). This layer illustratively is patterned to substantially align at least some of the diaphragm apertures 32 with some of the backplate apertures 24 in the manner discussed above.

Figure 7D:
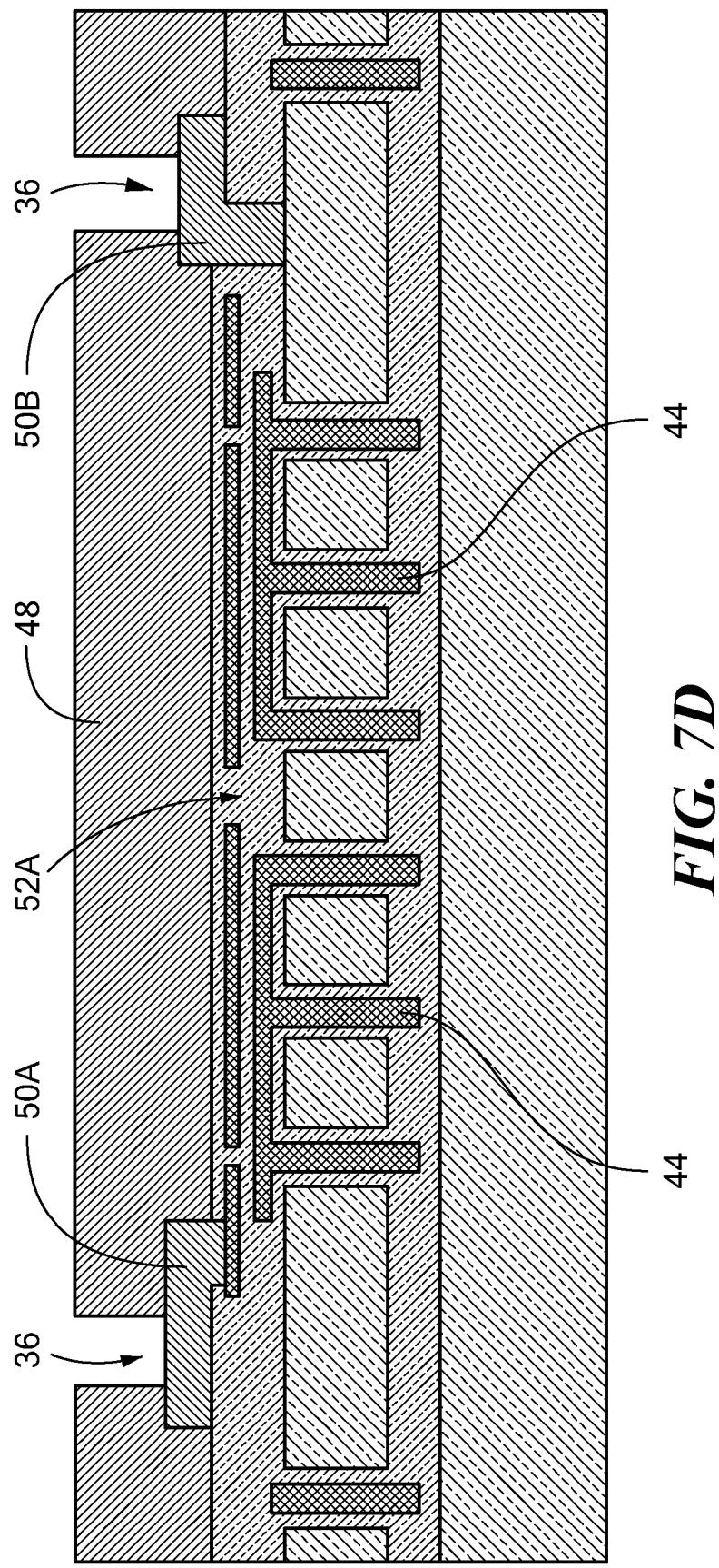

Nitride 48 for passivation and metal for electrical connectivity also are added (see FIG. 7D). For example, deposited metal may be patterned to form a first electrode 50A for placing electrical charge on the diaphragm 22, another electrode 50B for placing electrical charge on the backplate 20, and the contacts 36 for providing additional electrical connections.

The process then both exposes the diaphragm 22, and etches holes through the diaphragm 22 (step 608). As discussed below in greater detail, one of these holes ("diaphragm hole 52A") ultimately assists in forming a pedestal 54 that, for a limited time during this process, supports the diaphragm 22. A photoresist layer 56 then is added, completely covering the diaphragm 22 (step 610). This photoresist layer 56 serves the function of an etch mask.

Figure 7E:
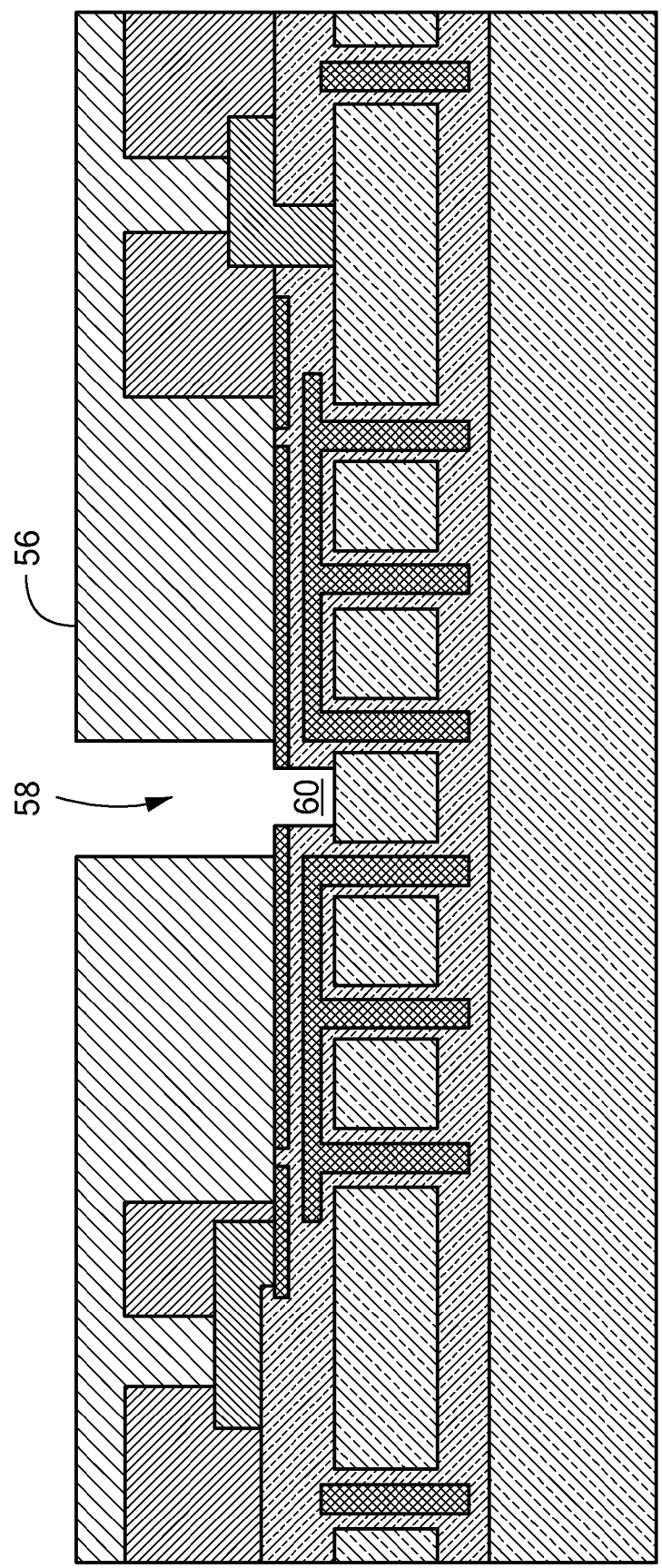

After adding the photoresist 36, the process exposes the diaphragm hole 52A (step 612). To that end, the process forms a hole ("resist hole 58") through the photoresist 36 by exposing that selected portion to light (FIG. 7E). This resist hole 58 illustratively has a larger inner diameter than that of the diaphragm hole 52A.

After forming the resist hole 58, the process forms a hole 60 through the oxide 42 (step 614). In illustrative embodiments, this oxide hole 60 effectively forms an internal channel that extends to the top surface of the SOI wafer 40.

It is expected that the oxide hole 60 initially will have an inner diameter that is substantially equal to the inner diameter of the diaphragm hole 52A. A second step, such as an aqueous HF etch, may be used to enlarge the inner diameter of the oxide hole 60 to be greater than the inner diameter of the diaphragm hole 52A. This enlarged oxide hole diameter essentially exposes a portion of the bottom side of the diaphragm 22. In other words, at this point in the process, the channel forms an air space between the bottom side of the diaphragm 22 and the top surface of the backplate 20.

Also at this point in the process, the entire photoresist layer 56 may be removed to permit further processing. For example, the process may pattern the diaphragm 22, thus necessitating removal of the existing photoresist layer 56 (i.e., the mask formed by the photoresist layer 56). Other embodiments, however, do not remove this photoresist layer 56 until step 622 (discussed below).

Figure 7F:
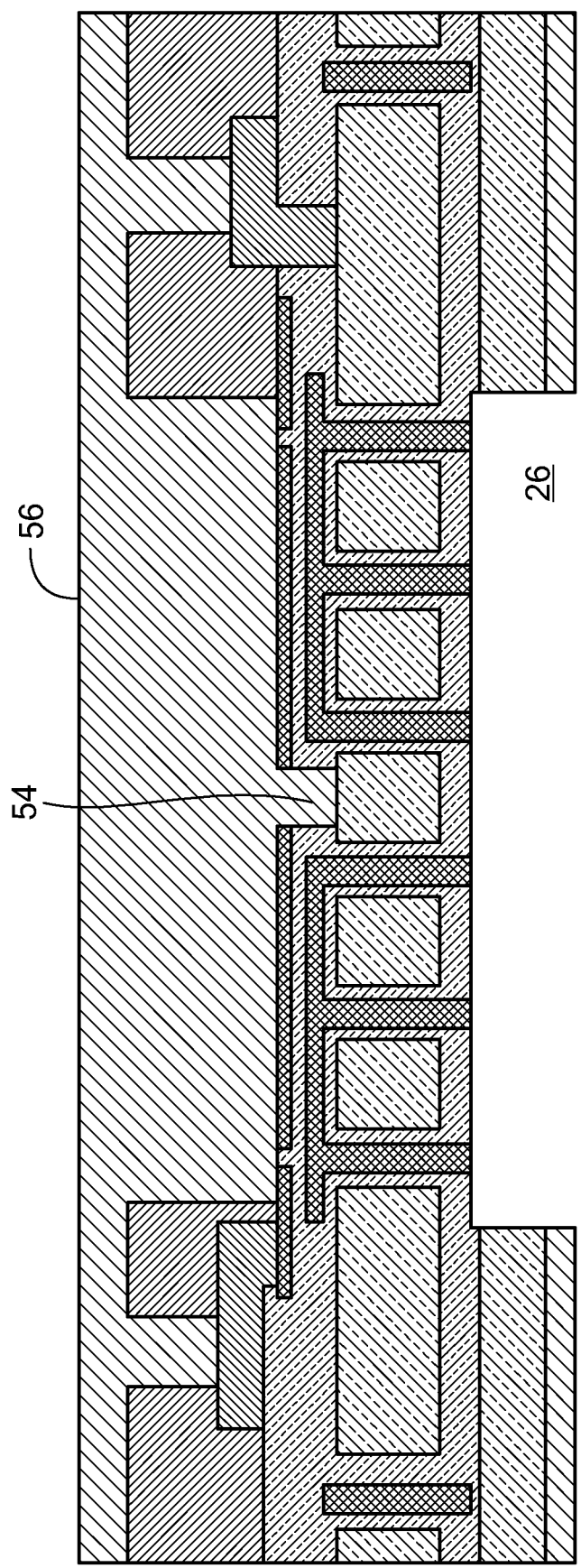

The process then continues to step 616, which adds more photoresist 36, to substantially fill the oxide and diaphragm holes 40 and 34 (FIG. 7F). The photoresist 36 filling the oxide hole 60 contacts the silicon of the top SOI layer, as well as the underside of the diaphragm 22 around the diaphragm hole 52A.

The embodiment that does not remove the original mask thus applies a sufficient amount of photoresist 36 in two steps (i.e., first the mask, then the additional resist to substantially fill the oxide hole 60), while the embodiment that removes the original mask applies a sufficient amount of photoresist 36 in a single step. In both embodiments, as shown in FIG. 7F, the photoresist 36 essentially acts as the single, substantially contiguous apparatus above and below the diaphragm 22. Neither embodiment patterns the photoresist 36 before the sacrificial layer is etched (i.e., removal of the sacrificial oxide 42 and polysilicon 44, discussed below).

In addition, the process may form the backside cavity 26 at this time. To that end, as shown in FIG. 7F, conventional processes may apply another photoresist mask on the bottom side of the SOI wafer 40 to etch away a portion of the bottom SOI silicon layer. This should expose a portion of the oxide layer within the SOI wafer 40. A portion of the exposed oxide layer then is removed to expose the remainder of the sacrificial materials, including the sacrificial polysilicon 44.

At this point, the sacrificial materials may be removed. To that end, the process removes the sacrificial polysilicon 44 (step 618) and then the sacrificial oxide 42 (step 620, FIG. 7G). Among other ways, illustrative embodiments remove the polysilicon 44 with a dry etch process (e.g., using xenon difluoride) through the backside cavity 26. In addition, illustrative embodiments remove the oxide 42 with a wet etch process (e.g., by placing the apparatus in an acid bath for a predetermined amount of time). Some embodiments, however, do not remove all of the sacrificial material. For example, such embodiments may not remove portions of the oxide 42. In that case, the oxide 42 may impact capacitance.

Figure 7G:
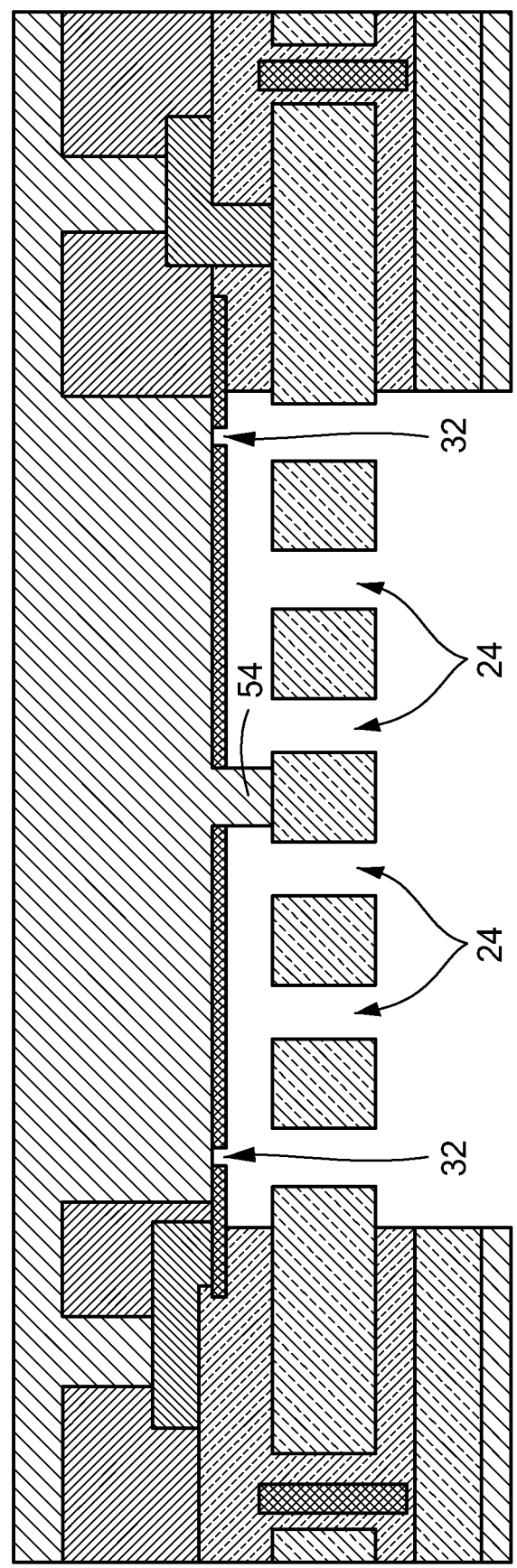

As shown in FIG. 7G, the photoresist 36 between the diaphragm 22 and top SOI layer supports the diaphragm 22. In other words, the photoresist 36 at that location forms a pedestal 54 that supports the diaphragm 22. As known by those skilled in the art, the photoresist 36 is substantially resistant to wet etch processes (e.g., aqueous HF process, such as those discussed above). It nevertheless should be noted that other wet etch resistant materials may be used. Discussion of photoresist 36 thus is illustrative and not intended to limit the scope of all embodiments.

Stated another way, a portion of the photoresist 36 is within the prior noted air space between the diaphragm 22 and the backplate 20; namely, it interrupts or otherwise forms a part of the boundary of the air space. In addition, as shown in the figures, this photoresist 36 extends as a substantially contiguous apparatus through the hole 52 in the diaphragm 22 and on the top surface of the diaphragm 22. It is not patterned before removing at least a portion of the sacrificial layers. No patterning steps are required to effectively fabricate the microphone 18.

To release the diaphragm 22, the process continues to step 622, which removes the photoresist 36/pedestal 54 in a single step. Among other ways, dry etch processes through the backside cavity 26 may be used to accomplish this step. This step illustratively removes substantially all of the photoresist 36—not simply selected portions of the photoresist 36.

It should be noted that a plurality of pedestals 42 may be used to minimize the risk of stiction between the backplate 20 and the diaphragm 22. The number of pedestals used is a function of a number of factors, including the type of wet etch resistant material used, the size and shape of the pedestals 42, and the size, shape, and composition of the diaphragm 22. Discussion of a single pedestal 54 therefore is for illustrative purposes.

Accordingly, illustrative embodiments at least partially align the diaphragm and backplate apertures 32 and 24 to more precisely set the low frequency cutoff.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS microphone comprising:
a stationary support forming a backside cavity;
a backplate having a plurality of backplate apertures including a first set of backplate apertures and a second set of backplate apertures, the first set of backplate apertures forming slots and the second set of backplate apertures forming round holes, the first set of backplate apertures positioned generally at the outer perimeter of the backplate and the second set of backplate apertures positioned generally toward the center of the backplate, the backplate being stationary relative to the stationary support; and
a diaphragm having a plurality of apertures, each aperture forming a slot, the diaphragm forming a variable capacitor with the backplate and having an off-center diaphragm aperture, at least one of the plurality of backplate apertures being aligned with the off-center diaphragm aperture to form a straight, unobstructed vertical channel that extends through the backside cavity.

2. The MEMS microphone as defined by claim 1 wherein the at least one of the backplate apertures is not offset from the diaphragm aperture.

3. The MEMS microphone as defined by claim 1 wherein the at least one of the backplate apertures forms a slot.

4. The MEMS microphone as defined by claim 1 wherein the backplate is generally parallel with and spaced in a vertical direction from the diaphragm, the at least one of the backplate apertures being substantially aligned with the diaphragm aperture in the vertical direction.

5. The MEMS microphone as defined by claim 1 further comprising a plurality of springs coupling the diaphragm to a substrate, the plurality of springs forming the diaphragm aperture.

6. The MEMS microphone as defined by claim 1 where at least some of the first set or second set of backplate apertures are offset from the diaphragm aperture and at least some of the first or second set of backplate apertures includes a backplate aperture aligned with the diaphragm aperture.

7. A MEMS microphone comprising:
a stationary support forming a backside cavity;
a movable diaphragm;
a plurality of springs movably connecting the diaphragm to the stationary support; and
a backplate spaced from the diaphragm, forming a variable capacitor with the diaphragm and being stationary relative to the stationary support,
the backplate forming a plurality of backplate apertures, the plurality of backplate apertures including a first set of backplate apertures and a second set of backplate apertures, the first set of backplate apertures forming slots and positioned generally at the outer perimeter of the backplate and the second set of backplate apertures forming round holes and positioned generally toward the center of the backplate,
the stationary support, diaphragm, and springs forming a plurality of diaphragm apertures, the plurality of diaphragm apertures including a first diaphragm aperture, the first diaphragm aperture forming a slot,
the first diaphragm aperture being at least partially aligned with at least one of the plurality of backplate apertures to form a straight, unobstructed vertical channel that extends through the backside cavity.

8. The MEMS microphone as defined by claim 7 wherein a second-diaphragm aperture is substantially aligned with another one of the plurality of backplate apertures.

9. The MEMS microphone as defined by claim 7 wherein the first diaphragm aperture is substantially aligned with the at least one backplate aperture.

10. The MEMS microphone as defined by claim 7 wherein a third backplate aperture is offset from the first diaphragm aperture.

11. The MEMS microphone as defined by claim 7 wherein the at least one backplate aperture forms a slot.

12. The MEMS microphone as defined by claim 7 wherein the diaphragm is formed from a deposited material, the backplate being formed from an SOI wafer.

13. The MEMS microphone as defined by claim 1 further comprising a plurality of diaphragm apertures and a plurality of backplate apertures, the diaphragm apertures and backplate apertures being aligned to form a plurality of straight, unobstructed vertical channels, each vertical channel extending through the back cavity.

14. The MEMS microphone as defined by claim 7 wherein the apertures of the first set of backplate apertures each generally form a slot.

15. A MEMS microphone comprising:
a stationary support forming a backside cavity;
a backplate having a plurality of backplate apertures including a first set of backplate apertures and a second set of backplate apertures, wherein each of the apertures of the first set of backplate apertures forming a slot and each of the apertures of the second set of backplate apertures is forming a round hole, the backplate being stationary relative to the stationary support; and
a diaphragm having a plurality of apertures, each of the diaphragm apertures forming a slot, the diaphragm forming a variable capacitor with the backplate and having an off-center diaphragm aperture, the backplate aperture having a center that is substantially aligned with the off-center diaphragm aperture to form a straight, unobstructed vertical channel that extends through the backside cavity.

16. The MEMS microphone as defined by claim 1 wherein each of the plurality of diaphragm apertures is made of an adjacent pair of springs, a stationary portion immediately adjacent to and between the spring pairs, and a corresponding diaphragm edge between the pair of springs.

17. The MEMS microphone as defined by claim 15 wherein the slots are each elongated holes.

18. The MEMS microphone as defined by claim 5 wherein the plurality of springs are serpentine shaped.

19. The MEMS microphone as defined by claim 7 wherein the plurality of springs are serpentine shaped.

20. The MEMS microphone as defined by claim 15 further comprising a plurality of springs coupling the diaphragm to a substrate, the plurality of springs forming the diaphragm aperture.

21. The MEMS microphone as defined by claim 20 wherein the plurality of springs are serpentine shaped.

22. The MEMS microphone as defined by claim 15 wherein the first set of backplate apertures is positioned generally at the outer perimeter of the backplate and the second set of backplate apertures is positioned generally at the center of the backplate.

* * * * *